United States Patent [19]
Faust et al.

[11] 3,930,865
[45] Jan. 6, 1976

[54] PHOTOPOLYMERIZABLE COPYING COMPOSITION

[75] Inventors: Raimund Josef Faust, Wiesbaden-Biebrich; Kurt Walter Klüpfel, Wiesbaden-Sonnenberg, both of Germany

[73] Assignee: Hoechst Aktiengesellschaft, Germany

[22] Filed: Dec. 18, 1974

[21] Appl. No.: 533,833

[30] Foreign Application Priority Data
Dec. 21, 1973 Germany............................ 2363806

[52] U.S. Cl. .................... 96/86 P; 96/33; 96/35.1; 96/36.7; 96/36.3; 96/87 R; 96/115 P; 204/159.16
[51] Int. Cl.$^2$ ...................... G03C 1/68; G03C 1/70
[58] Field of Search ............... 96/115 P, 86 P, 87 R; 204/159.16

[56] References Cited
UNITED STATES PATENTS

| | | | |
|---|---|---|---|
| 3,796,578 | 3/1974 | Hosoi et al. ........................ 96/115 P |
| 3,804,631 | 4/1974 | Faust ................................. 96/115 P |
| 3,833,384 | 9/1974 | Noonan et al. .................... 96/115 P |
| 3,850,770 | 11/1974 | Juna et al. ......................... 96/115 P |

*Primary Examiner*—Ronald H. Smith
*Attorney, Agent, or Firm*—James E. Bryan

[57] ABSTRACT

The invention relates to a photopolymerizable copying composition comprising at least one polymerizable compound, at least one photo-initiator, and at least one copolymer of (A) an unsaturated carboxylic acid, (B) an alkyl methacrylate with at least 4 carbon atoms in the alkyl group, and (C) at least one additional monomer which is capable of copolymerization with monomers (A) and (B), the homopolymer of said additional monomer having a glass transition temperature of at least 80°C.

16 Claims, No Drawings

PHOTOPOLYMERIZABLE COPYING COMPOSITION

This invention relates to a novel photopolymerizable copying composition which may be in the form of a liquid or of a solid layer on a support, and which comprises, as the essential components, at least one polymerizable unsaturated compound, at least one photoinitiator, and at least one copolymer binder which is composed of at least three different monomer units and is soluble or at least swellable in aqueous alkalies.

Among photopolymerizable copying compositions and copying materials for reprographic purposes, e.g. for the photomechanical production of printing forms, those are preferred which can be developed with preponderantly aqueous, in particular aqueous-alkaline solutions, because they do not pollute air or waste waters and, unlike developers consisting of organic solvents, comply with the laws pertaining to the protection of the environment.

Aqueous or aqueous-alkaline developer solutions also have the advantage over organic solvents that they are less expensive, harmless, physiologically unobjectionable, and can be processed more easily because the dissolved copying composition may be separated from used developer solution by acidification and subsequent filtration.

Further, alkaline solutions have the advantage that they clean, and sometimes even hydrophilize, the surfaces of the metal supports to which they are applied.

Copying layers capable of aqueous-alkaline development are known. The desired property is normally produced by the addition of binders which are soluble or at least swellable in aqueous alkaline media. In most cases, homopolymers or copolymers are used which comprise carboxylic acid groups, carboxylic anhydride groups, phenolic or alcoholic hydroxyl groups, or similar groups which serve to make the compounds soluble in aqueous alkaline media.

Copying compositions comprising such binders (see German Auslegeschrift No. 1,194,707) have proved to be very suitable for certain purposes, e.g. for the preparation of offset printing plates on superficially modified aluminum supports.

If other metals are used as supports, e.g. chromium, brass, and especially copper, the adhesion of these layers is insufficient, i.e. during development not only the unexposed parts of the layer, but also exposed parts thereof are attached and partially dissolved away.

In the case of a copolymer comprising two substances, the acid content is determined by the requirement that the material should be developable with aqueous alkaline developers and should possess optimum resistance to the developer. Therefore, the degree of freedom resulting from the free selection of the co-monomer is limited, so that layers of optimum quality, especially as regards resistance, flexibility, compatibility, tackiness and the like, cannot be obtained.

For this reason, it is impossible to produce layers of the desired degree of flexibility and, at the same time, good adhesion to copper, from copolymers of styrene and methacrylic acid, acrylic acid, maleic acid or maleic acid half esters, which are described for the same purpose in German Offenlegungsschrift No. 2,205,146.

The problem is particularly serious in the preparation of etch resists for multi-metal plates, of relief or intaglio printing plates, of printed circuits, and for chemical milling.

It has been observed, e.g., that during the etching process, the etching agent penetrates under the edges of the etch resist, i.e., that a so-called under-cutting takes place, by which "kerns" are produced which are no longer supported by the support plate. These kerns are particularly sensitive to mechanical attack and may be easily broken, e.g. during a spray etching process, so that the etching agent gains access to further portions of the support surface.

This undesirable behavior may be observed, e.g., in the case of copolymers of methyl methacrylate and methacrylic acid, styrene and maleic acid, and their derivatives, and is due to the fact that these copolymers have a very high glass transition temperature (Tg of at least 100°C) which imparts to the exposed layer a brittleness that is too high for practical use. The quantity "Tg" is defined and explained, e.g., in "Polymer Handbook", published by I. Brandrup and E. H. Immergut, Interscience Publishers, New York-London-Sydney, 1965.

Attempts have been made to eliminate this drawback by adding plasticizers to the photopolymer layers, but normally, the adhesion of the layers is further reduced by such an addition. Further, it has been found that photopolymer layers containing relatively large quantities of low molecular weight monomers tend to be tacky, so that they can be processed only with difficulty.

U.S. Pat. No. 3,804,631 discloses photopolymerizable copying compositions comprising at least one polymerizable compound, at least one photo-initiator, and at least one copolymer of methacrylic acid and one or more alkyl methacrylates, at least one of the alkyl methacrylates having an alkyl group with 4 to 15 carbon atoms.

Terpolymers of methacrylic acid, methyl or ethyl methacrylate, and an alkyl methacrylate having from 4 to 15 carbon atoms in the alkyl group are preferred.

Some of these copolymers made up of monomer units imparting sufficiently low glass transition temperatures (Tg below 20°C) are distinguished by a good adhesion to copper and other metals, but their absorption capacity for liquid photomonomers is limited. Thus, it is impossible, for example, to produce non-tacky resist layers with a monomer concentration which is sufficient to impart adequate lightsensitivity, from the copolymers of methacrylic acid and at least one alkyl methacrylate having more than 4 carbon atoms in the alkyl group (Tg below 20°C), which have an exceptionally good adhesion to copper. Further, these compositions have the disadvantage that, due to cold flow, their dimensional stability is not very good, so that the resist layers tend to exhibit annoying signs of flowing during storage and processing of the layers, for example at the edges of the bore holes of through-hole printed circuits and in areas where pressure is applied.

It is the object of the present invention to provide a photopolymerizable copying composition which possesses the advantages of the copying composition according to U.S. Pat. No. 3,804,631, supra, in particular its aqueous-alkaline developability, flexibility, resistance to etching and electroplating baths, and good adhesion to metals after exposure, but which, in addition, is non-tacky and whose cold flow in the unexposed state is reduced.

The copying composition according to the present invention comprises, as the binder, a copolymer of A. an unsaturated carboxylic acid.
B. an alkyl methacrylate with at least 4 carbon atoms in the alkyl group, and
C. an additional monomer which is capable of copolymerization with monomers (A) and (B) and whose corresponding homopolymer has a glass transition temperature of at least 80°C.

Suitable components (C) of the terpolymer according to the invention are the following compounds, for example:

Styrene or substituted styrene, e.g. vinyl toluene, p-chlorostyrene, α-chlorostyrene, α-methylstyrene, vinyl ethyl benzene, o-methoxystyrene, or m-bromostyrene; vinyl naphthalene or substituted vinyl naphthalene; heterocyclic vinyl compounds, e.g. N-vinyl carbazole, vinyl pyridine, or vinyl oxazole; vinyl cycloalkanes, e.g. vinyl cyclohexane, or 3,5-dimethyl-vinyl cyclohexane; acrylamide methacrylamide, N-alkylacrylamide, acrylonitrile, methacrylonitrile, aryl methacrylate, aralkyl methacrylate, and others.

According to a preferred embodiment of the invention, the copying composition comprises a terpolymer in which the component (C) is styrene, p-chloro-styrene, vinyl toluene, vinyl cyclohexane, acrylamide, methacrylamide, N-alkylacrylamide, phenyl methacrylate, acrylonitrile, methacrylonitrile, or benzyl methacrylate, styrene being preferred.

The glass transition temperature of the corresponding homopolymer must be at least 80°C, preferably at least 100°C.

Methacrylic acid, acrylic acid, crotonic acid, sorbic acid, or maleic and itaconic acid or their half-esters are preferably used as unsaturated carboxylic acids (A). Methacrylic acid is of particular advantage.

Normally, the alkyl methacrylate (B) has from 4 to 20, preferably from 6 to 12 carbon atoms in the alkyl group.

Preferably, the glass transition temperature of the corresponding homopolymer should not exceed 20°C.

Further, it is possible for the copolymer binder to include, in addition to the components (A), (B), and (C), an additional alkyl methacrylate which is capable of copolymerization with these components, but which may contain less than 4 carbon atoms in the alkyl group. Of course, more than one representative of each of the components (A), (B) and (C) may be present.

Binders made up of four monomer units are preferred, for example, when a fine adjustment of certain properties, such as the adhesion of the copying composition to newly developed metal alloys, is desired.

Monomer component (A) is used in concentrations between 10 and 40 percent by weight, preferably between 16 and 40 percent by weight; component (B) is preferably used in concentrations ranging from 35 to 83 percent by weight; and component (C) is used in concentrations between about 1 and 35 percent by weight, preferably between 3 and 25 percent by weight.

The copying layers produced with the copying compositions according to the invention are distinguished in that they possess an excellent adhesion to metallic supports, especially to copper, after exposure, are very flexible, and have an excellent adsorption capacity for liquid monomers. Further, the copolymers have the important advantage that the flexibility of the resist layer can be adjusted as desired, i.e. the desired consistency of the layer may be selected within a wide range, by selecting adequate ratios between the concentration of monomer (B) and the concentration of monomer (C). By a suitable selection of the concentration of component (C), the cold flow of the layer may be reduced to such a degree, even in the presence of a high concentration of the normally liquid photomonomer, that no disturbing flow phenomena of the resist layer occur, even at temperatures up to 60°C, which is of particular importance when the resist layer is to be sandwiched between two plastic films and stored and shipped in the form of a roll of dry resist film.

Whereas the relative concentrations of the monomers (B) and (C) are variable in the copolymer, the concentration of monomer (A), preferably methacrylic acid, is determined by the requirement that the material should be capable of a rapid development in an aqueous alkaline medium and should be as resistant as possible to the developer solution used. The most favorable proportion of the carboxyl group component in the copolymer was found to be at acid numbers from about 50 to a maximum of 250, preferably between 120 and 210; this corresponds, for example, to a methacrylic acid content of about 10 to 40 percent by weight. The most favorable range may differ somewhat for different binders, because it depends not only on the nature of the monomer (A), but also on the type and concentration of monomers (B) and (C). In addition, the average molecular weight and the chemical and molecular uniformity exert a certain influence upon the optimum COOH concentration within the copolymer which is to be selected. The most favorable molecular weights are in the range between 20,000 and 200,000; the acid number of the copolymer binder should be higher the higher the average molecular weight of the copolymer.

If the acid number is to be kept relatively low, in spite of a relatively high molecular weight, it is advisable to add a small quantity of a water-miscible organic solvent and/or a wetting agent to the developer in order to facilitate its attack upon the copying layer to be developed.

When the copying compositions according to the invention are used for the preparation of photoresist materials, in particular of dry resist forms for use as etch resist or electro resist masks — for which purpose they are preferred — the light-hardened resists are distinguished by an excellent resistance to etching and a very good adhesion to the customary supporting materials. The good adhesion is particularly important in the case of copper surfaces such as those used in the production of printed circuits, multi-metal plates, and letter press printing forms, because with these materials the adhesion of photopolymer layers has hitherto presented special problems, so that adhesion-promoting agents had to be added. The adhesion of the inventive layers to other metal supports, such as chromium, brass zinc or steel, is also very good.

When the etch resists produced from the copying compositions according to the invention are undercut, very resistant, flexible resist kerns results which are not broken during spraying with the etching solutions, even if relatively high pressure is applied. The flexibility of the exposed resist layers produced with the novel binders is not accompanied by a softness and cold flow in the unexposed state, as is the case with other known binders. It has been found to be of particular advantage that the layers according to the invention display an adequate dimensional stability, even in the unexposed state.

The flexibility of the copying layer is of advantage not only during the etching step, but also for other purposes, for example in the preparation of offset and letterpress printing forms, because a brittle layer tends to form hairline cracks when the printing form is bent.

The copying composition according to the invention may be marketed in known manner in the form of a solution or dispersion which is used by the customer especially for the preparation of etch resist layers. Preferably, however, the copying compositions according to the invention are used for the preparation of dry resist films composed of a dry thermoplastic photoresist layer on an intermediate support. Such dry resist films are laminated by the customer to the surface which is to be etched or image-wise electroplated and are then exposed and developed in situ, the intermediate support, normally a plastic film, being removed before development.

The copying composition according to the invention is particularly suitable for this type of use. Alternatively, it may be mass-produced in the form of a layer on a suitable support, e.g. aluminum or zinc, as a pre-sensitized copying material, from which offset or letterpress printing forms may be produced by photomechanical means. Further, the copying composition according to the invention may be used for the preparation of relief images, screen printing stencils, color proofing foils, and the like.

The essential components of the copying composition according to the present invention are monomers, photo-initiators, and the aforementioned binders; in addition thereto, the copying composition may contain various other additives, such as stabilizers to reduce the thermal polymerization of the copying composition, hydrogen donors, sensitometric agents, dyestuffs, colored and uncolored pigments, color couplers, and indicators.

Preferably, however, these additives should be so selected that they do not unduly absorb the actinic light required for the initiating process.

A variety of substances may be used as photo-initiators in the copying compositions according to the invention, for example: benzoin, benzoin ethers, multi-nuclear quinones, e.g. 2-ethyl-anthraquinone; acridine derivatives, e.g. 9-phenyl-acridine, 9-p-methoxyphenyl-acridine, 9-acetylamino-acridine, benz(a)-acridine; phenazine derivatives, e.g. 9,10-dimethyl-benz(a)-phenazine, 9-methyl-benz(a)-phenazine, 10-methoxy-benz(a)-phenazine; quinoxaline derivatives, such as 6,4',4''-trimethoxy-2,3-diphenyl-quinoxaline, 4',4''-dimethoxy-2,3-diphenyl-5-aza-quinoxaline; quinazoline derivatives, synergistic mixtures of different ketones, dye-redox systems, thiopyrylium salts, and others.

The photopolymerizable monomers which may be used for the copying composition according to the invention are known and are described, e.g., in U.S. Pat. Nos. 2,760,863, and 3,060,023. Particularly preferred are the acrylic and methacrylic acid esters, such as diglycerin diacrylate, polyethylene glycol dimethacrylate, acrylates and methacrylates of trimethylol ethane, trimethylol propane, pentaerythritol and polyhydric alicyclic alcohols. The reaction products of diisocyanates with partial esters of polyhydric alcohols are used with particular advantage. Monomers of this type are described in German Offenlegungsschrift No. 2,064,079. Generally, the methacrylates are preferred to the acrylates.

Aliphatic polyethers are preferably used as hydrogen donors. In some cases, this function may be assumed by the binder or the polymerizable monomer, provided these compounds possess unstable hydrogen atoms.

In addition to the copolymers used according to the invention, the copying composition may contain small quantities of other binders, for example those which are not soluble in aqueous alkaline solutions. Care must be taken, however, that such additions do not detract from the advantages resulting from the use of the above-described copolymers.

Suitable supports for the copying materials produced from the copying compositions according to the invention are, for example, foils or screens of aluminum, steel, zinc, copper or plastic materials, e.g. polyethylene terephthalate or cellulose acetate films. The surface of the support may be chemically or mechanically pre-treated in order to adjust the adhesion of the layer or to reduce the reflection of the support in the actinic range of the copying layer (anti-halation). Light-sensitive materials are produced in known manner from the copying composition according to the invention. Thus, it is possible to dissolve or disperse the copying composition in a solvent and apply the resulting solution or dispersion to the desired support by casting, spraying, immersion, roller application and the like, followed by drying of the resulting film. Relatively thick layers (of 250μ and more, for example) also may be produced by extrusion or molding, and the resulting self-supporting films are then laminated to the support.

The copying layers thus produced are exposed and developed in known manner. Suitable developers are, above all, aqueous-alkaline solutions, e.g. solutions of alkali phosphates, alkali borates, or alkali silicates, to which small quantities of wetting agents and/or water-miscible organic solvents may be added, if desired. If is also possible to use, as alkalies, aqueous solutions of aliphatic amines which may be buffered, if necessary.

As already mentioned, the copying compositions according to the invention may be used for a wide variety of applications. They are used with particular advantage, either directly or in the form of dry resist films, for the preparation of etch resist masks or electro resist masks on metallic supports, e.g. copper, copper supports being particularly suitable for the preparation of printed circuits, of letterpress printing forms, and of multi-metal offset printing forms. The excellent adhesion and flexibility of the exposed areas of the layers renders the layers particularly advantageous.

In the following examples, individual embodiments of the copying composition according to the invention are illustrated. Unless otherwise stated, percentages and proportions are by weight. One part by weight is 1 g when the unit per volume is 1 milliliter. The proportions by weight of the monomeric components of the copolymers are the quantities employed during polymerization.

EXAMPLE 1

A solution of

| | |
|---|---|
| 5.6 | parts by weight of a copolymer of 50 parts by weight of methacrylic acid, 100 parts by weight of 2-ethylhexylmethacrylate, and 15 parts by weight of acrylonitrile, |
| 5.6 | parts by weight of a monomer produced by reacting 1 mole of 2,2,4-trimethyl-hexamethylene diisocyanate with 2 moles of hydroxyethyl methacrylate (see German Offenlegungsschrift No. 2,064,079, Ex. 1), |
| 0.2 | part by weight of 9-phenylacridine, |
| 0.15 | part by weight of triethyleneglycol dimethacrylate, |
| 0.015 | part by weight of Michler's ketone, and |
| 0.06 | part by weight of 2,4-dinitro-6-chloro-2'-acetamido-5'-methoxy-4'-(β-hydroxyethyl-β'-cyanoethyl)-amino-azobenzene, |

-continued

| | |
|---|---|
| 13.0 | parts by weight of methyl ethyl ketone, and |
| 40.0 | parts by weight of ethyleneglycol monoethyl ether | is whirler-coated onto a 25μ thick biaxially stretched polyethylene terephthalate film and dried for 2 minutes at 100°C. The resulting layer is 18μ thick. The layer thus applied is flexible and its furface is not tacky at room temperature.

The material thus produced may be used in this form as a dry resist film. For this purpose, it is laminated at a temperature between 115° and 130°C onto a phenoplast laminate to which a 35μ thick copper foil had been applied, using a laminator type 9 LD manufactured by General Binding Corporation, USA. The plate is then exposed for 10 to 30 seconds in a xenon copying apparatus (type Bikop, model Z, 8 kilowatts) manufactured by Messrs. Klimsch & Co., Frankfurt/Main, Germany, the distance between the lamp and the printing frame being 80 cm. A screen test plate marketed by Messrs. Heidenhain, Traunreut, Germany, and having lines of a width from 4 mm down to 5μ is used as the original. After development, the polyester layer is pulled off and the copying layer is developed with an aqueous alkaline developer having the following composition:

1,000 parts by weight of water,
15 parts by weight of sodium metasilicate nonahydrate,
3 parts by weight of polyglycol 6000,
0.6 part by weight of levulinic acid, and
0.3 part by weight of strontium hydroxide octahydrate.

The pH value of this solution is 11.3. Development is effected by wiping for 60 to 100 seconds or by spraying with a "Processor A 24" spraying device marketed by DuPont. Finally, the plate is rinsed with water.

Very sharp-edged resist lines of the same dimensions as in the original are thus produced, lines down to a width of 50μ being accurately reproduced.

The resist thus produced may be used as an etch resist for iron-III-chloride solutions (42°C, 42°Be). If a spray etching machine of type 412 G, marketed by Chemcut, Solingen, Germany, is used, a spray etching time of 45 seconds is required.

The above-described polymer binder may be replaced by the same quantity of a terpolymer of methacrylic acid, decyl methacrylate, and 1-vinyl naphthalene (50 : 90 : 15 parts by weight), or of a terpolymer of methacrylic acid, decyl methacrylate, and p-chlorostyrene (45 : 80 : 25 parts by weight), or of a terpolymer of methacrylic acid, n-hexylmethacrylate, and 1-vinyl naphthalene (40 : 75 : 15 parts by weight), or of a terpolymer of methacrylic acid, n-hexylmethacrylate, and acrylonitrile (95 : 175 : 50 parts by weight). If the above-described procedure is followed, in each case very sharp-edged etch or electro resist masks of excellent adhesion are obtained after exposure and development.

EXAMPLE 2

A first solution I is prepared from:

| | |
|---|---|
| 5.6 | parts by weight of a terpolymer of methacrylic acid, n-hexylmethacrylate, and acrylonitrile (95 : 175 : 50 parts by weight), |
| 5.6 | parts by weight of 1,1,1-trimethylolethane triacrylate, |
| 0.085 | part by weight of 9-phenylacridine, |
| 0.1 | part by weight of the blue azo dyestuff used in Example 1, and |
| 40.0 | parts by weight of ethyleneglycol monoethyl ether, | and is whirler-coated onto an electrolytically roughened and anodically hardened aluminum support whose oxide layer has a thickness corresponding to 3 g per square meter. This layer is then covered with a coating solution II prepared from

| | |
|---|---|
| 5.6 | parts by weight of a partially saponified polyvinyl alcohol having a K-value of 8 and an unsaponified acetyl group content of 12%, |
| 1.9 | parts by weight of a partially saponified polyvinyl alcohol having a K-value of 4 and an unsaponified acetyl group content of 12%, |
| 0.75 | part by weight of a wetting agent derived from ethoxylated coconut oil alcohol, and |
| 92.4 | parts by weight of deionized water, | which acts as an oxygen barrier layer. After drying, this second layer weights 5 g per square meter. The planographic printing plate thus produced is then exposed for 1 minute under a negative original combining a 21 step half-tone grey wedge having a density range of 0.05 to 3.05 and density increments of 0.15 with 60-line and 120-line line and dot screen elements, and developed by wiping for 1 minute with the developer solution used in Example 1. The image is then fixed with 1 percent phosphoric acid and inked with black greasy ink. 7 steps of the above described step wedge are fully exposed. The printing plate thus produced is now ready for printing in an offset machine.

The binder used in this example may be replaced by the same quantity of a terpolymer of 45 parts by weight of methacrylic acid, 80 parts by weight of decyl methacrylate, and 25 parts by weight of N-tert,-butyl-acrylamide. When the above described procedure is followed, an offset printing plate ready for use is produced in which 7 steps of the step wedge are fully exposed.

EXAMPLE 3

A coating solution is prepared from:

| | |
|---|---|
| 5.6 | parts by weight of a terpolymer of 45 parts by weight of methacrylic acid, 80 parts by weight of decyl methacrylate, and 25 parts by weight of p-chlorostyrene, |
| 5.6 | parts by weight of a monomer produced by reacting 1 mole of 2,2,4-trimethyl-hexamethylene diisocyanate with 2 moles of hydroxy ethyl methacrylate, |
| 0.085 | part by weight of 9-phenylacridine, |
| 0.1 | part by weight of the blue azo dyestuff used in Example 1, and |
| 40.0 | parts by weight of ethylene glycol monoethyl ether, | and is whirler-coated onto an electrolytically roughened aluminum support carrying an oxide layer weighing 3 g per square meter. After drying, a layer results which weighs 3.5 g per square meter. The copying layer is then covered with the solution II described in Example 2.

After drying, the oxygen-impermeable coating weights 5.0 g per square meter.

By the procedure described in Example 2, an offset printing plate is produced in which 8 steps of the step wedge are fully hardened.

The same coating solution may be used for the prepartion of a dry resist film. For this purpose, the solution is applied as described in Example 1 to a 25μ thick polyethylene terephthalate film so that a layer weighing 12 g per square meter is produced, and the coated polyethylene terephthalate film is lamintated as described in Example 1 onto a copper circuit board and then exposed and developed. The exposure time is 10 seconds. A sharp-edged flexible etch resist is thus obtained which has a good adhesion and excellent resistance to developer solutions and which possesses a

EXAMPLE 4

A solution of

| | |
|---|---|
| 6.5 | parts by weight of a copolymer of 30 parts by weight of methacrylic acid, 60 parts by weight of n-hexyl methacrylate, and 10 parts by weight of styrene, |
| 5.6 | parts by weight of a monomer prepared by reacting 1 mole of 2,2,4-trimethyl-hexamethylene diisocyanate with 2 moles of hydroxyethyl methacrylate, |
| 0.15 | part by weight of triethyleneglycol dimethacrylate, |
| 0.2 | part by weight of 9-phenyl acridine, |
| 0.015 | part by weight of Michler's ketone, |
| 0.06 | part by weight of the blue azo dyestuff used in Example 1 |
| in | |
| 15.0 | parts by volume of methyl ethyl ketone, | is whirler-coated as described in Example 1 onto a $25\mu$ thick polyester film. After drying, the layer thus produced is $18\mu$ thick. By laminating and exposing (15 seconds) the layer as described in Example 1, and then developing it for 90 seconds with 0.4 percent by weight sodium carbonate solution, an etch resist or electro resist mask is produced whose chemical resistance is excellent. If the resist is etched with an iron-III-chloride solution (42° Be, 42° C), using the Chemcut apparatus described in Example 1, sharp-edged tracks remain on the circuit board which are resistant to the pressure exerted during spraying.

If the dry resist film is to be used as an electro resist mask, the procedure differs only to the extent that a positive original is used for exposure.

The resist is then electroplated, first in a copper pyrophosphate bath marketed by Messrs. Schlötter, Geislingen/Steige, Germany; current density: 4 A/dm²; bath temperature: 50°C; pH value: 8; duration: 10 minutes; and then in a gold bath marketed by Messrs. Blasberg, Solingen, Germany, type "Autronex N": current density; 0.6 A/dm²; bath temperature: 20°C; pH value: 3.5 to 4.0; duration: 10 minutes.

By another method, the circuit board is first electroplated in an acid copper bath, the so-called "Feinkorn-Kupferplastikbad MS" marketed by Messrs. Schlötter; current density: 2 A/dm²; bath temperature: 20°C; duration: 30 minutes; then for 5 minutes in a nickel bath, type "Norma", also marketed by Messrs. Schlötter: current density: 4 A/dm²; bath temperature: 50°C; pH value: between 3.5 and 4.5; and finally for 15 minutes in a gold bath, type "Autronex N", marketed by Messrs. Blasberg, Solingen, Germany: current density: 0.6 A/dm²; bath temperature: 20°C; pH value: 3.5 to 4.0.

It is noted that the dry resist has an excellent resistance to the different electroplating baths used.

After decoating the circuit boards produced as described above by placing them in a 4 percent solution of NaOH at a temperature of 40°C, the copper areas still existing between the conductor tracks produced by electroplating are etched away. The high quality printed circuits thus produced are distinguished by the vertical structure and the sharp edges of the conductor tracks. Moreover, due to the high resolution capacity of the material, a very high density of the conductor tracks is possible, since conductor tracks down to lines of a width of $50\mu$ can be reproduced.

EXAMPLE 5

A solution of

| | |
|---|---|
| 6.5 | parts by weight of a copolymer of 30.8 parts by weight of methacrylic acid, 46.2 parts by weight of n-hexylmethacrylate, and 23.0 parts by weight of N-vinyl carbazole, |
| 5.6 | parts by weight of a monomer obtained by reacting 1 mole of 2,2,4-trimethyl-hexamethylene diisocyanate with 2 moles of hydroxy ethyl methacrylate, |
| 0.15 | part by weight of triethyleneglycol dimethacrylate, |
| 0.2 | part by weight of 9-phenyl-acridine, |
| 0.015 | part by weight of Michler's ketone, and |
| 0.06 | part by weight of the blue azo dyestuff used in Example 1, |
| in | |
| 15.0 | parts by weight of methyl ethyl ketone | is processed as described in Example 1 into an $18\mu$ thick dry resist film, which is then laminated to a cleaned copper circuit board at a temperature of 130°C.

| Exposure: | as in Example 1, for 15 seconds; |
|---|---|
| Development: | by 4 minutes' spraying with 0.4 per cent sodium carbonate solution in a spray development apparatus, type Processor A 24, marketed by Du Pont, Neu-Isenburg, Germany. |

The material is further processed into printed circuits under the conditions described in Example 4.

EXAMPLE 6

A solution of

| | |
|---|---|
| 6.5 | parts by weight of a copolymer of 95 parts by weight of methacrylic acid, 175 parts by weight of n-hexyl methacrylate, and 50 parts by weight of acrylonitrile, |
| 5.6 | parts by weight of a monomer obtained by reacting 1 mole of 2,2,4-trimethyl-hexamethylene diisocyanate with 2 moles of hydroxyethyl methacrylate, |
| 0.125 | part by weight of 9-phenyl-acridine, |
| 0.15 | part by weight of triethyleneglycol dimethacrylate, |
| 0.03 | part by weight of the blue azo dyestuff used in Example 1, |
| in | |
| 15.0 | parts by volume of methyl ethyl ketone | is whirler-coated onto a polyester film carrying a layer produced from the solution II described in Example 2 and weighing 5 g per square meter. The light-sensitive copying layer thus produced weighs 42 g per square meter.

The resist layer is then laminated, analogouslly to the procedure described in Example 1, onto a cleaned copper circuit board at a temperature of 130°C. After removal of the polyester film, the thin intermediate layer of polyvinyl alcohol remains on the resist, where it serves as an oxygen-impermeable barrier layer.

| Exposure: | 15 seconds, using the exposure device described in Example 1, |
|---|---|
| Development: | by 2 minutes' moving, with light rubbing, in the developer solution described in Example 1. |

The etch resist or electro resist mask thus produced possesses an excellent resistance to chemicals.

A dry resist film of this thickness also may be used for the preparation of through-hole printed circuits, bore holes up to a diameter of 2 mm being covered, if desired.

EXAMPLE 7

A solution of (a) 5.6 parts by weight of a copolymer of
50 parts by weight of methacrylic acid,
95 parts by weight of n-hexylmethacrylate, and
11.7 parts by weight of p-chlorostyrene,
5.6 parts by weight of a monomer obtained by reacting
1 mole of 2,2,4-trimethyl-hexamethylene diisocyanate with 2 moles of hydroxy ethyl methacrylate,
0.2 part by weight of 9-phenyl-acridine,
0.15 part by weight of triethylene glycol dimethacrylate,
0.015 part by weight of Michler's ketone,
0.06 part by weight of the azo dyestuff used in Example 1, and
20.0 parts by weight of ethylene glycol monoethyl ether is whirler-coated onto a $25\mu$ thick, biaxially stretched polyethylene terephthalate film and dried at 100°C. The resulting layer weights 25 g per square meter. The dry resist film thus produced is flexible and its surface is dry. Further processing is as described in Examples 1 and 5:

Exposure: 25 seconds, using the xenon copying apparatus used in Example 1,
Development: by moving for 120 seconds, with light rubbing, in the developer solution described in Example 1.

Resist masks are thus produced which adhere very well to copper and are resistant to developer solutions, etches, and electroplating baths.

Instead of the copolymer used in Example 7a, one of the following copolymers may be used:

(b) 5.6 parts by weight of a copolymer of
45 parts by weight of methacrylic acid,
100 parts by weight of 2-ethylhexyl methacrylate, and
7.5 parts by weight of acrylonitrile.
(c) 5.6 parts by weight of a copolymer of
50 parts by weight of methacrylic acid,
100 parts by weight of n-hexyl methacrylate, and
10 parts by weight of 1-vinyl naphthalene.

The dry resist films obtained from these copolymers yield excellently adhering etch resists and electroresists.

EXAMPLE 8

A solution of (a) 5.6 parts by weight of a copolymer of
175 parts by weight of 2-ethylhexyl methacrylate
30 parts by weight of acrylonitrile,
20 parts by weight of ethyl methacrylate, and
95 parts by weight of methacrylic acid,
5.6 parts by weight of a monomer obtained by reacting
1 mole of 2,2,4-trimethyl-hexamethylene diisocyanate with 2 moles of hydroxy ethyl methacrylate,
0.15 part by weight of triethylene glycol dimethacrylate,
0.2 part by weight of 9-phenyl acridine,
0.015 part by weight of Michler's ketone,
0.06 part by weight of the blue azo dyestuff used in Example 1
in
20.0 parts by weight of ethylene glycol monoethyl ether and
12.5 parts by weight of methyl ethyl ketone is whirler-coated onto a polyester film as described in Example 1. After drying, a layer weighing 30 g per square meter is obtained. Further processing, i.e. lamination at 140°C, 20 seconds' exposure, and development as in Example 1, results in an etch resist or electro resist mask which is distinguished by a very good resistance to chemical attack, high resolution capacity, and sharp-edged resist lines.

If the copolymer used under (a) is replaced by the same quantity of:

(b) a copolymer of
175 parts by weight of 2-ethyl-hexyl methacrylate,
30 parts by weight of acrylonitrile,
20 parts by weight of ethyl acrylate, and
95 parts by weight of methacrylic acid, a flexible dry resist film is obtained which adheres very well to copper surfaces and which, as a layer weighting 28 g per square meter, is very well suited for the preparation of printed circuits by electroplating (see Example 4).

EXAMPLE 9

A solution of 32.7 parts by weight of a 30.6 per cent methyl ethyl ketone solution of a polymer of
57.7 parts by weight of n-hexyl methacrylate,
11.3 parts by weight of styrene,
10.0 parts by weight of methyl methacrylate, and
21.0 parts by weight of methacrylic acid (acid number: 130),
5.6 parts by weight of the monomer described in Example 1,
0.15 part by weight of triethylene glycol dimethacrylate,
0.2 part by weight of 9-phenyl acridine, and
0.018 part by weight of Michler's ketone, is further diluted by adding 10 parts by volume of methyl ethyl ketone, and the solution is then whirler-coated as described in Example 1 onto a polyester film. After the layer has been dried for 5 minutes at 100° C, it has a weight of 30 g per square meter. At a temperature between 115° and 130°C and using a laminator type 25 manufactured by Messrs. Dynachem, USA, the resist film is applied to a laminate composed of a phenoplast layer applied to a $35\mu$ thick copper foil.

The material thus produced is then exposed for 20 seconds under a screen test original as described in Example 1.

Then the plate is developed for 90 to 100 seconds with a 1 percent aqueous sodium metasilicate nonahydrate solution, the nonpolymerized areas of the layer being removed.

The hardened resist bridges which are retained possess an excellent resistance to electroplating baths, so that, as described in Example 4, alkaline copper pyrophosphate baths and also acid fine-grain copper electroplating baths (a product of Schlotter) may be used for building up the electrotype.

EXAMPLE 10

A solution of 6.4 parts by weight of a copolymer of
20.0 parts by weight of methacrylic acid,
11.3 parts by weight of styrene, and
68.7 parts by weight of n-butyl methacrylate,
3.6 parts by weight of the monomer described in Example 1,
0.13 part by weight of 9-phenylacridine,
0.01 part by weight of Michler's ketone,
0.1 part by weight of triethylene glycol dimethacrylate,
0.03 part by weight of the dyestuff described in Example 1, and
15.0 parts by weight of methyl ethyl ketone is processed, as described in Example 1, to yield a $28\mu$ thick dry resist film which is then laminated at 1302 C to a cleaned copper circuit board.

Exposure: as described in Example 1, 30 seconds,
Development: 90 seconds with a 1 per cent aqueous solution of monoethanol amine, using a "Processor 24" spray developing apparatus manufactured by DuPont, Neu-Isenburg, Germany.

The material is then further processed under the conditions described in Example 4, to yield printed circuits.

It will be obvious to those skilled in the art that many modifications may be made within the scope of the present invention without departing from the spirit therof, and the invention includes all such modifications.

What is claimed is:

1. A photopolymerizable copying composition comprising at least one polymerizable compound, at least one photo-initiator, and at least one copolymer of
    A. an unsaturated carboxylic acid,
    B. an alkyl methacrylate with at least 4 carbon atoms in the alkyl group, and
    C. at least one additional monomer which is capable of copolymerization with monomers (A) and (B), the homopolymer of said additional monomer having a glass transition temperature of at least 80°C.

2. A copying composition according to claim 1 which comprises methacrylic acid, acrylic acid, crotonic acid, sorbic acid, maleic or itaconic acid, or the half-esters thereof, as monomer (A).

3. A copying composition according to claim 2 which comprises methacrylic acid as the unsaturated carboxylic acid (A).

4. A copying composition according to claim 1 in which the alkyl methacrylate (B) has from 4 to 20 carbon atoms in the alkyl group.

5. A copying composition according to claim 1 which comprises styrene, p-chlorostyrene, vinyl toluene, vinyl naphthalene, vinyl carbazole, vinyl cyclohexane, acrylamide, methacrylamide, N-alkyl-acrylamide, phenyl methacrylate, acrylonitrile, methacrylonitrile, or benzyl methacrylate as the monomeric component (C).

6. A copying composition according to claim 1 in which the homopolymer of the monomeric component (C) has a glass transition temperature of at least 100°C.

7. A copying composition according to claim 6 in which styrene is the monomeric component (C).

8. A copying composition according to claim 1 in which, in the copolymer, the component (A) is present in a concentration of about 10 to 40 percent by weight, the component (B) is present in a concentration of about 35 to 83 percent by weight, and the component (C) is present in a concentration of about 1 to not more than 35 percent by weight.

9. A copying composition according to claim 1 in the form of a solid light-sensitive layer on a metallic support.

10. A copying composition according to claim 9 in which the support is a copper support.

11. A copying composition according to claim 1 in the form of a solid, transferable light-sensitive layer on an intermediate plastic film support.

12. A copying composition according to claim 1 containing a copolymer of 30 parts by weight of methacrylic acid, 60 parts by weight of n-hexyl methacrylate, and 10 parts by weight of styrene.

13. A copying composition according to claim 1 containing a copolymer of 50 parts by weight of methacrylic acid, 100 parts by weight of n-hexyl methacrylate, and 10 parts by weight of 1-vinyl naphthalene.

14. A copying composition according to claim 1 containing a copolymer of 20 parts by weight of methacrylic acid, 68.7 parts by weight of n-butyl methacrylate, and 11.3 parts by weight of styrene.

15. A copying composition according to claim 1 containing a copolymer of 50 parts by weight of methacrylic acid, 100 parts by weight of 2-ethyl-hexyl methacrylate, and 15 parts by weight of acrylonitrile.

16. A copying composition according to claim 1 containing a copolymer of 95 parts by weight of methacrylic acid, 175 parts by weight of n-hexyl methacrylate, and 50 parts by weight of acrylonitrile.

* * * * *